(12) United States Patent
Khang et al.

(10) Patent No.: US 7,635,628 B2
(45) Date of Patent: Dec. 22, 2009

(54) NONVOLATILE MEMORY DEVICE AND METHOD OF MANUFACTURING THE SAME

(75) Inventors: Yoon-ho Khang, Yongin-si (KR); Eun-hye Lee, Seoul (KR); Myoung-jae Lee, Suwon-si (KR); Sun-ae Seo, Hwaseong-si (KR); Seung-Eon Ahn, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 200 days.

(21) Appl. No.: 11/354,011

(22) Filed: Feb. 15, 2006

(65) Prior Publication Data

US 2006/0193175 A1 Aug. 31, 2006

(30) Foreign Application Priority Data

Feb. 16, 2005 (KR) ............... 10-2005-0012915

(51) Int. Cl.
*H01L 21/336* (2006.01)
(52) U.S. Cl. .................. 438/264; 438/216; 438/240; 438/257; 438/259; 438/266; 257/314; 257/315; 257/E21.209
(58) Field of Classification Search .......... None
See application file for complete search history.

(56) References Cited

U.S. PATENT DOCUMENTS

| | | | |
|---|---|---|---|
| 6,407,424 B2 | 6/2002 | Forbes | |
| 6,586,785 B2 * | 7/2003 | Flagan et al. | 257/261 |
| 6,674,138 B1 | 1/2004 | Halliyal et al. | |
| 6,754,108 B2 | 6/2004 | Forbes | |
| 6,784,480 B2 | 8/2004 | Bhattacharyya | |
| 6,803,272 B1 | 10/2004 | Halliyal et al. | |
| 2004/0256662 A1 * | 12/2004 | Black et al. | 257/317 |
| 2005/0141281 A1 * | 6/2005 | Jung | 365/185.23 |
| 2005/0167734 A1 * | 8/2005 | She et al. | 257/321 |
| 2005/0173755 A1 * | 8/2005 | Forbes | 257/316 |
| 2006/0118853 A1 * | 6/2006 | Takata et al. | 257/314 |

FOREIGN PATENT DOCUMENTS

| | | |
|---|---|---|
| KR | 10-2001-0096861 A | 11/2001 |
| KR | 2002-0079812 | 10/2002 |
| KR | 2002-0092383 | 12/2002 |
| KR | 10-2004-0059415 A | 7/2004 |
| KR | 10-2004-0064965 A | 7/2004 |

OTHER PUBLICATIONS

Korean Office Action (with English translation) dated Apr. 25, 2006.

* cited by examiner

*Primary Examiner*—N Drew Richards
*Assistant Examiner*—Kyoung Lee
(74) *Attorney, Agent, or Firm*—Buchanan Ingersoll & Rooney PC

(57) ABSTRACT

The nonvolatile memory device includes a semiconductor substrate on which a source, a drain, and a channel region are formed, a tunneling oxide film formed on the channel region, a floating gate formed of a transition metal oxide (TMO) on the tunneling oxide, a blocking oxide film formed on the floating gate, a gate electrode formed on the blocking oxide film.

10 Claims, 4 Drawing Sheets

NONVOLATILE MEMORY DEVICE AND METHOD OF MANUFACTURING THE SAME

CROSS-REFERENCE TO RELATED PATENT APPLICATION

Priority is claimed to Korean Patent Application No. 10-2005-0012915, filed on Feb. 16, 2005, in the Korean Intellectual Property Office, the disclosure of which is incorporated herein in its entirety by reference.

BACKGROUND OF THE INVENTION

1. Field of the Invention

The present invention relates to a nonvolatile memory device and a method of manufacturing the same, and more particularly, to a nonvolatile memory device having increased trap site density and a method of manufacturing the same.

2. Description of the Related Art

A unit memory cell of semiconductor memory devices, such as DRAM, includes one transistor and one capacitor. Therefore, to increase the integration density of a semiconductor memory device, the reduction of the volume of a transistor or the volume of a capacitor, or the volumes of both a transistor and a capacitor, is necessary.

In the case of the initial memory devices when the integration density of the semiconductor memory devices is not big issue, photography and etching processes could be performed with sufficient process margins. Therefore, the integration density of semiconductor memory devices could be increased by reducing the volumes of elements that constitute the semiconductor memory devices.

However, a new method, different from the conventional art, is required as the demand of semiconductor memory devices having high integration density increases.

The integration density of a semiconductor memory device is closely related to a design rule. Therefore, to increase the integration density of a semiconductor memory device, a strict design rule must be applied. In this case, the process margins of photolithography and etching processes can be significantly reduced. This denotes that the photolithography and etching processes must be performed more precisely.

When process margins of the photolithography and etching processes are reduced, a yield also can be reduced. Therefore, a method to increase the integration density of semiconductor memory devices without reducing the yield is needed.

To meet the requirements, many semiconductor memory devices having different structures from conventional semiconductor memory devices have introduced. The new semiconductor memory devices include a data storing medium that can store charges on an upper side of a transistor and has a data storing function different from a conventional capacitor.

A SONOS memory device is also one of a newly introduced semiconductor memory device. FIG. 1 is a cross-sectional view illustrating a conventional memory device.

Referring to FIG. 1, a source region 12 and a drain region 14 to which an n type conductive dopant is implanted on a p type semiconductor substrate 10 (hereinafter, semiconductor substrate) are formed. A channel region 16 is formed between the source 12 and the drain 14. Also, a gate stack 18 is formed on the channel region 16 of the semiconductor substrate 10. The gate stack 18 is composed of a tunneling oxide film 18a, a nitride film $Si_3N_4$ 18b, a blocking oxide film 18c, and a gate electrode 18d. Here, the nitride film 18b has a trap site having predetermined density. Therefore, when a predetermined voltage is applied to the gate electrode 18d, electrons passed through the tunneling oxide film 18a are trapped in the trap site of the nitride film 18b. The blocking oxide film 18c blocks the migration of electrons to the gate electrode 18d while the electrons are trapped.

In the conventional semiconductor memory device, binary scale information can be stored and read using the characteristic of varying the threshold voltage between when electrons are trapped and when not trapped in the trap site of the nitride film 18b.

Here, when the density of a trap site increases, more electrons can be trapped. Then, the variation of threshold voltage can be increased. That is, the density of the trap site can significantly affect the characteristics of a memory device. Conventionally, to increase the density of a trap site, techniques of scattering or depositing nano scale particle sizes, such as Si-nano particles, on a surface of a thin film have been developed. However, these methods have limits to increase the density of trap site per unit area. These methods have various technical problems, especially, the non-uniformity of particle size and particle distribution, to be applied to a flash memory.

SUMMARY OF THE DISCLOSURE

The present disclosure provides a nonvolatile memory device having increased trap site density and a method of manufacturing the same.

The present disclosure also provides a nonvolatile memory device comprising: a semiconductor substrate on which a source, a drain, and a channel region are formed; a tunneling oxide film formed on the channel region; a floating gate formed of a transition metal oxide (TMO) on the tunneling oxide; a blocking oxide film formed on the floating gate; a gate electrode formed on the blocking oxide film.

According to an aspect of the present disclosure, there is provided a method of manufacturing a nonvolatile memory device, comprising: preparing a semiconductor substrate on which a source, a drain, and a channel region are formed; forming a tunneling oxide film on the channel region; forming a floating gate on the tunneling oxide using a TMO; forming a blocking oxide film on the floating gate; and forming a gate electrode on the blocking oxide film.

According to the present disclosure, a nonvolatile memory device having increased trap site density can be obtained. Therefore, the signal processing speed of the memory device can be increased, and large capacity memory devices can be manufactured since multi-bit data can be stored in a unit cell.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE DISCLOSURE

Figure 1:
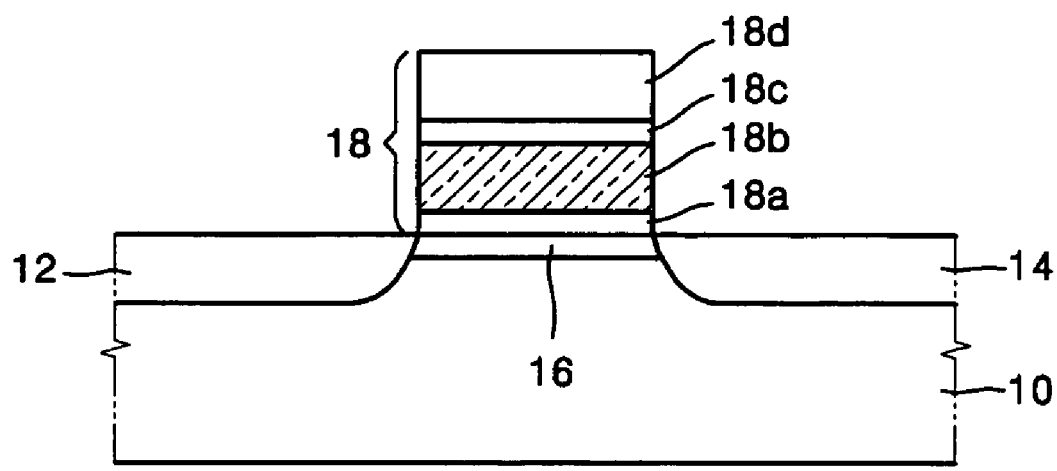
FIG. 1 is a cross-sectional view illustrating a conventional SONOS memory device.

The present invention will now be described more fully with reference to the accompanying drawings in which exemplary embodiments of the invention are shown. In the drawings, the thicknesses of layers and regions are exaggerated for clarity.

Figure 2:
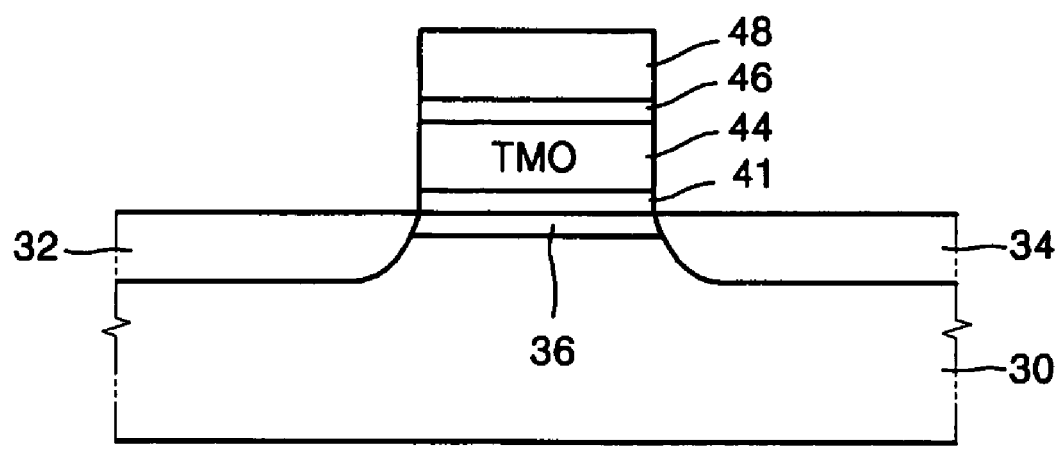
FIG. 2 is a cross-sectional view illustrating a nonvolatile memory device according to an embodiment of the present invention.

FIG. 2 is a cross-sectional view illustrating a nonvolatile memory device according to an embodiment of the present invention.

Referring to FIG. 2, a nonvolatile memory device according to the present disclosure comprises a substrate 30 on which a source 32, a drain 34, and a channel region 36 are formed, and a tunneling oxide film 41, a floating gate 44 formed of a transition metal oxide (TMO), a blocking oxide film 46, and a gate electrode 48 sequentially stacked on the channel region 36. Here, the detailed descriptions of the tunneling oxide film 41, the blocking oxide film 46, and the gate electrode 48 are omitted since the functions and materials for forming these elements are well known in the art. For example, the tunneling oxide film is formed of $SiO_2$. Also, the tunneling oxide film 41 can be formed of a material having a higher dielectric constant high-k than the silicon oxide, such as $Al_2O_3$ or $ZrO_2$.

The source 32 and drain 34 regions are formed by implanting a conductive dopant on the substrate 30 and the channel region 36 is formed between the source and the drain regions 32 and 34.

An aspect of the present disclosure is that the floating gate 44 is formed of a TMO. Here, the TMO is a compound of an element selected from the group consisting of transition metals in the periodical table combined with oxygen. Example of the transition metal oxides are niobium oxide $Nb_2O_5$, nickel oxide NiO, titanium oxide $TiO_2$, hafnium oxide $HfO_2$, or $ZrO_2$. These transition metal oxides have a predetermined trap site density, and the floating gate 44 formed of the transition metal oxide can trap greater electrons than a conventional floating gate formed of a Si-nitride or a Si-nanocrystal. Therefore, the memory effect of a nonvolatile memory device can be increased. Especially, in the case of the floating gate 44 formed of a metal-rich transition metal oxide, that is, a transition metal oxide in which the content of a transition metal is greater relatively to the content of oxygen, the efficiency of trapping electrons is high and the memory characteristics of the nonvolatile memory device is further increased. The floating gate 44 is preferably formed in a thin film shape. However, the floating gate 44 can have the shape of nanoparticle or wire. When the floating gate 44 is formed in a thin film shape, processes for controlling the size and distribution of nano particles accompanied when the floating gate is formed of Si-nano particles are unnecessary, and the process for manufacturing a floating gate can be continued without interruptions.

The blocking oxide film 46 blocks the migration of trapped electrons into the gate electrode 48 while electrons are trapped in the trap site. The blocking oxide film 46 is conventionally formed of $SiO_2$, but the present invention is not limited thereto and can be formed of other oxides. The blocking oxide film 46 can be formed of a material having a higher dielectric constant high-k than the silicon oxide $SiO_2$, such as $Al_2O_3$ or $ZrO_2$.

In a nonvolatile memory device having the above structure, when a predetermined voltage is applied to the gate electrode 48, electrons entered into the tunneling oxide film 41 are trapped in the floating gate 44 formed of a TMO. The blocking oxide film 46 blocks the migration of trapped electrons into the gate electrode 48 while electrons are trapped in the trap site. Therefore, the nonvolatile memory device according to the present disclosure can store and read binary information using the characteristic of varying a threshold voltage between when electrons are trapped floating gate 44 and when the electrons are not trapped.

To increase the density of a conventional trap site, a technique of forming a floating gate by scattering or depositing Si-particles on a surface of a tunneling oxide film has been developed. However, these methods have a limit to increase the density of trap site per unit area. However, according to the present disclosure, a nonvolatile memory device having higher trap site density than that of in the prior art can be obtained by replacing the material for forming the floating gate 44 with a TMO. Accordingly, in a nonvolatile memory device having the above structure, the signal processing speed of the memory device is increased, and also, high capacity memory devices can be manufactured since a multi-bit data can be stored in a unit cell. Also, the memory effect of the nonvolatile memory device is increased and the manufacturing of high integration memory devices can be realized since the volume of the memory device can be reduced.

FIGS. 3A through 3E are cross-sectional views illustrating a method of manufacturing a nonvolatile memory device according to an embodiment of the present disclosure. In the present disclosure, each of the thin films can be formed using a well known method, such as a physical vapor deposition (PVD) method.

Figure 3A:
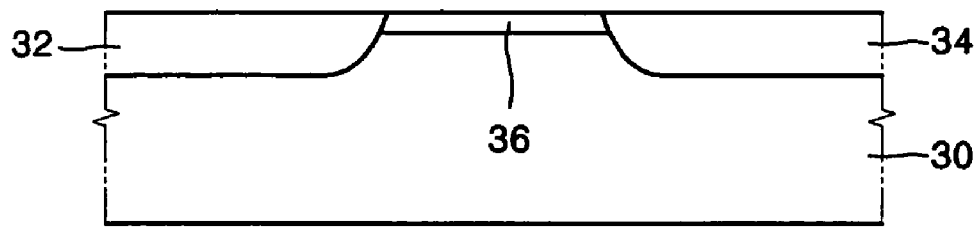
FIGS. 3A through 3E are cross-sectional views illustrating a method of manufacturing a nonvolatile memory device according to an embodiment of the present invention.
Figure 3B:
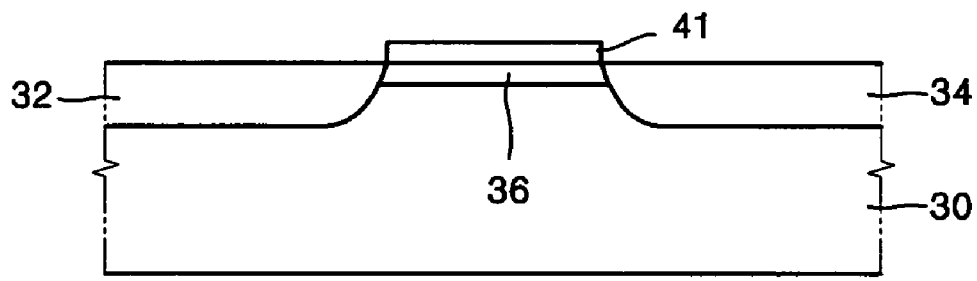

Referring to FIGS. 3A and 3B, a semiconductor substrate 30, on which a source 32, a drain 34, and a channel region 36 are formed, is prepared. The source and the drain regions 32 and 34 can be formed by implanting a conductive dopant in the substrate 30 and the channel region 36 is formed between the source and the drain regions 32 and 34. Next, a tunneling oxide film 41 is formed on the channel region 36. The tunneling oxide film 41 is conventionally formed of $SiO_2$, but the present disclosure is not limited thereto and can be formed of other oxides. For example, the tunneling oxide film 41 can be formed of a material, such as $Al_2O_3$ or $ZrO_2$, having a higher constant high-k than the silicon oxide $SiO_2$.

Figure 3C:
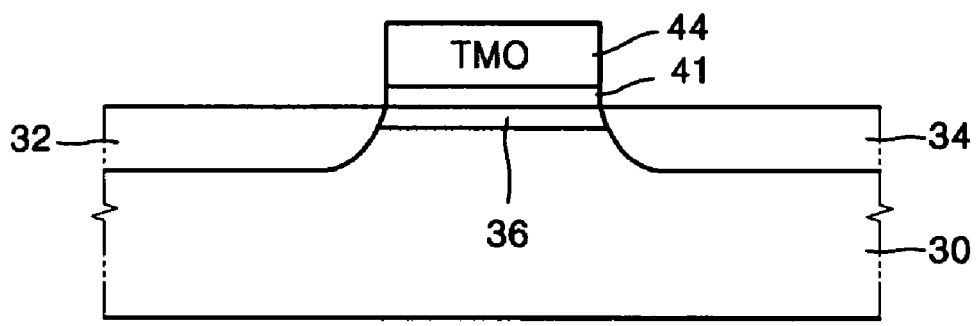

Referring to FIG. 3C, a floating gate 44 formed of a TMO is formed on the tunneling oxide film 41. The floating gate 44 can be formed by depositing a TMO on the tunneling oxide film 41 using a PVD method. More specifically, after forming a TMO by supplying a transition metal source into a chamber maintained at oxygen atmosphere, the TMO is deposited on the tunneling oxide film 41. Here, the TMO is a compound of an element selected from the group consisting of transition metals in the periodical table combined with oxygen. Example of the transition metal oxides are niobium oxide $Nb_2O_5$, nickel oxide NiO, titanium oxide $TiO_2$, hafnium oxide $HfO_2$, or $ZrO_2$.

The floating gate 44 is preferably formed of a metal-rich transition metal oxide, that is, a transition metal oxide in which the content of a transition metal is greater relatively to the content of oxygen. The content of oxygen $O_2$ in the TMO can be controlled by controlling process variables, such as temperature, gas atmosphere, and pressure of the vacuum chamber when depositing the TMO using the PVD method, and in this way, the metal-rich transition metal oxide can be deposited. When the floating gate 44 is formed of a metal-rich transition metal oxide, the efficiency of trapping electrons is increased and the memory characteristics of the nonvolatile memory device is further increased.

The floating gate 44 is preferably formed in a thin film shape. However, the floating gate 44 can have the shape of nanoparticle or wire. When the floating gate 44 is formed in a thin film shape, processes for controlling the size and distribution of nano particles accompanied when the floating gate is formed of Si-nano particles are unnecessary, and the process for manufacturing a floating gate can be continued without interruptions.

Figure 3D:
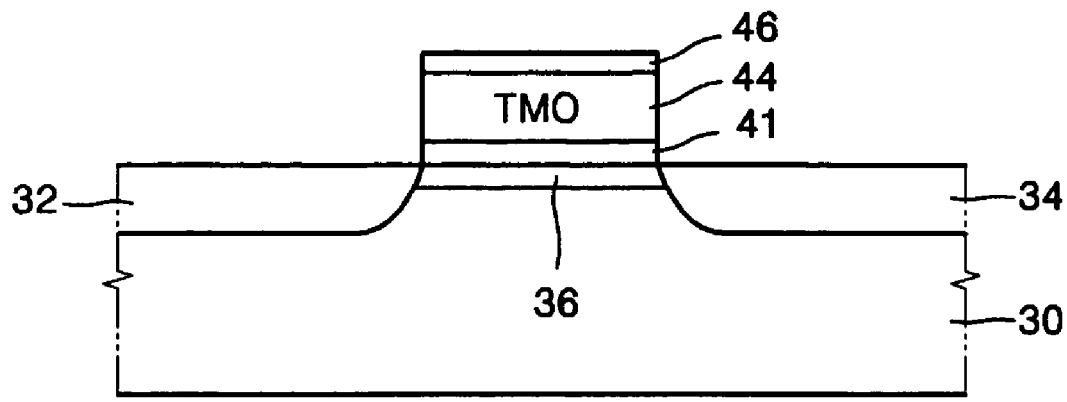

Referring to FIG. 3D, a blocking oxide film 46 is formed on the floating gate 44. The blocking oxide film 46 blocks the migration of trapped electrons into the gate electrode 48 while electrons are trapped in the trap site. The blocking oxide film 46 is conventionally formed of $SiO_2$, but the present disclosure is not limited thereto and can be formed of other oxides. The blocking oxide film 46 can be formed of a material having a higher dielectric constant high-k than the silicon oxide $SiO_2$, such as $Al_2O_3$ or $ZrO_2$.

Figure 3E:
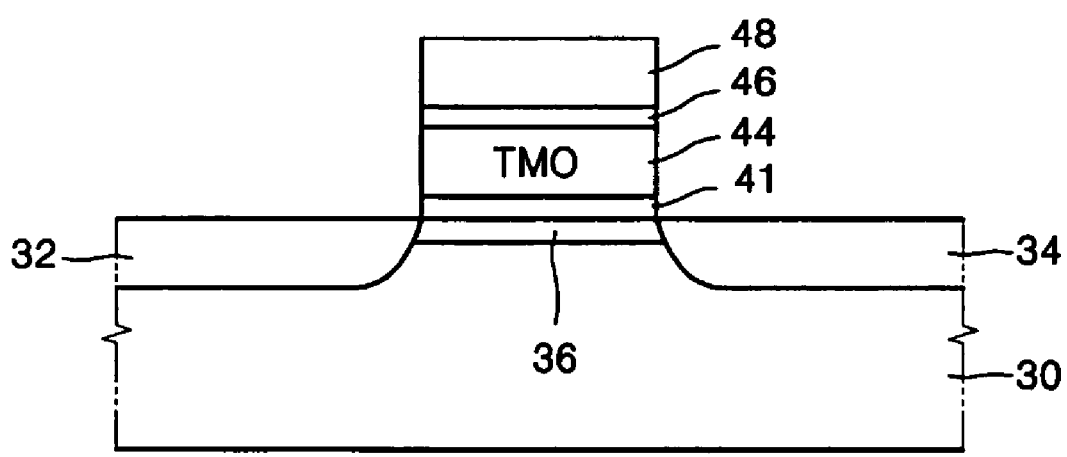

Referring to FIG. 3E, a gate electrode 48 is formed on the blocking oxide film 46. The gate electrode 48, as it is well known in the art, is formed of a conductive material, such as aluminum Al. Accordingly, a nonvolatile memory device having increased trap site density can be obtained through the above processes.

Figure 4:
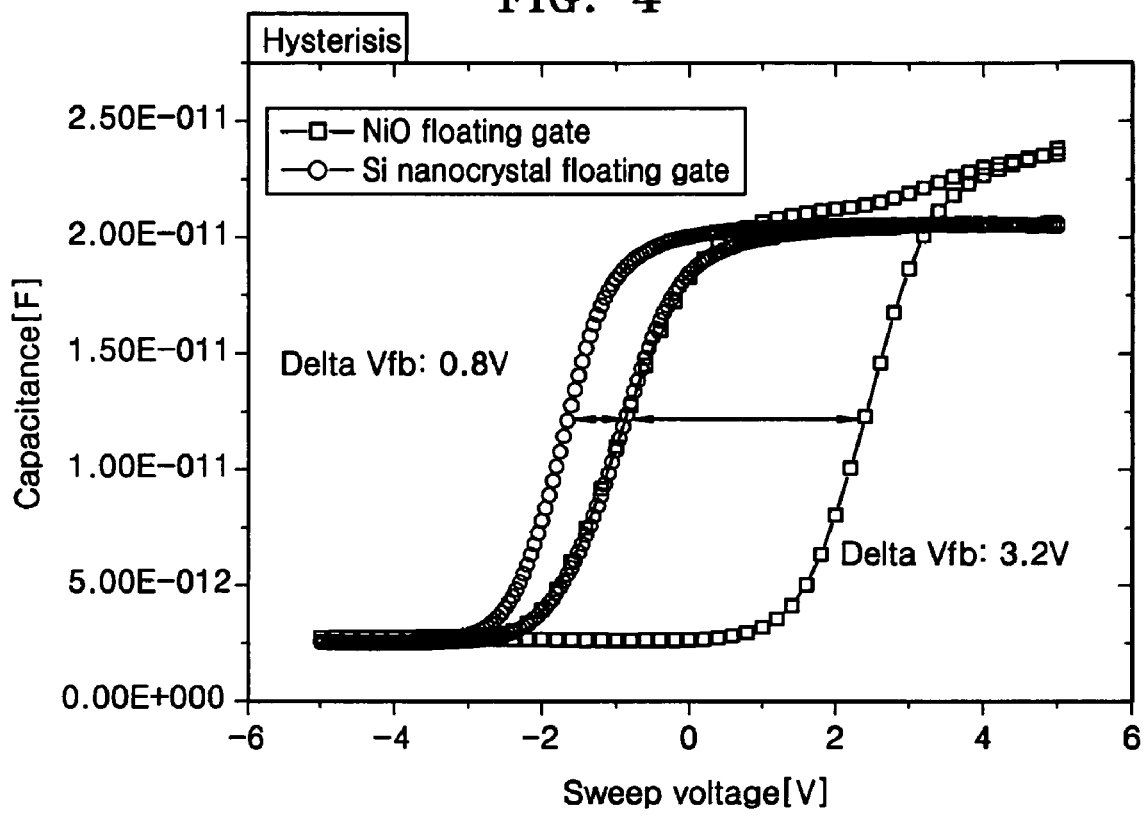
FIG. 4 is a graph showing a capacitance-voltage (C-V) characteristic of a nonvolatile memory device according to the present disclosure.

FIG. 4 is a graph showing a capacitance-voltage (C-V) characteristic of a nonvolatile memory device according to the present disclosure. Here, also a C-V characteristic of a nonvolatile memory device having a floating gate formed of conventional Si-nano particles is depicted for comparison purposes. It is seen that a nonvolatile memory device according to the present disclosure shows superior memory effect than that of a prior art.

Figure 5:
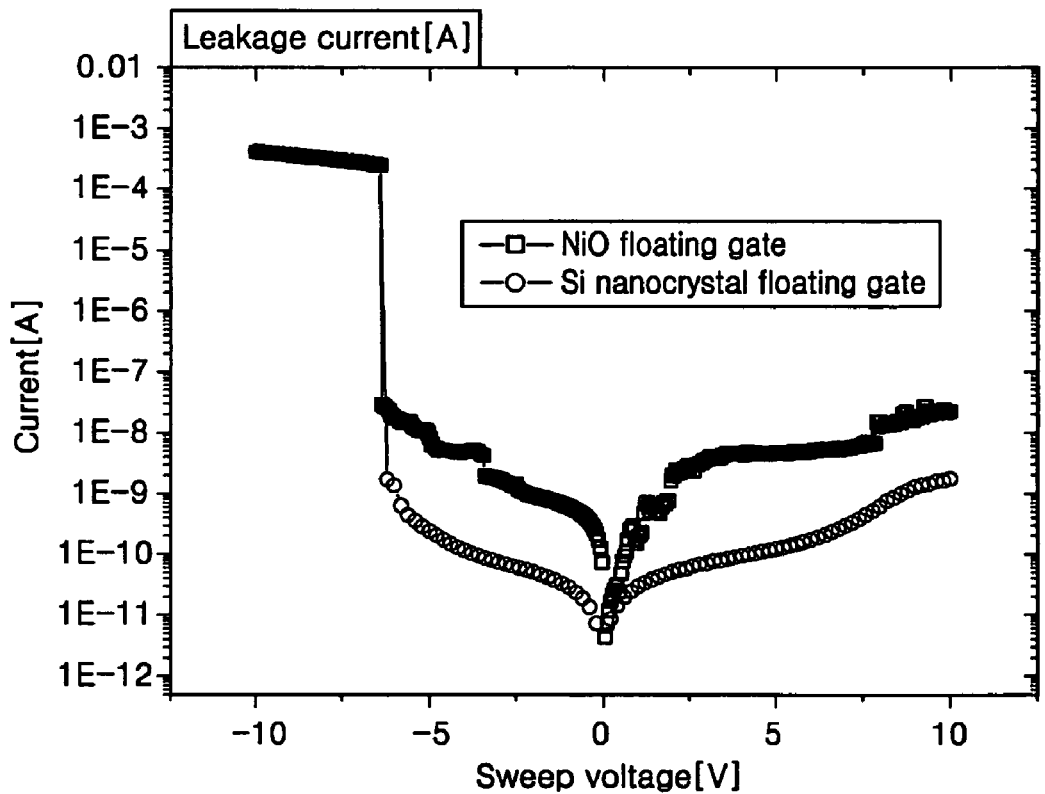
FIG. 5 is a graph showing a current-voltage (I-V) characteristic of a nonvolatile memory device according to the present disclosure.

FIG. 5 is a graph showing a current-voltage (I-V) characteristic of a nonvolatile memory device according to the present disclosure. Here, also an I-V characteristic of a nonvolatile memory device having a floating gate formed of conventional Si-nano particles is depicted for comparison purposes. It is seen that a nonvolatile memory device according to the present disclosure shows a good I-V characteristic.

According to the present disclosure, a nonvolatile memory device having increased trap site density can be obtained. A nonvolatile memory device having increased trap site density shows a large variation of threshold voltage when electrons are trapped in the trap site. Therefore, the signal processing speed of the memory device can be increased and large memory capacity devices can be manufactured since multi-bit data can be stored in a unit cell.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A nonvolatile memory device comprising:
a semiconductor substrate on which a source, a drain, and a channel region are formed;
a tunneling oxide film formed on the channel region;
a floating gate formed of a transition metal oxide (TMO) on the tunneling oxide;
a blocking oxide film formed on the floating gate; and
a gate electrode formed on the blocking oxide film, wherein the TMO is a material selected from the group consisting of $Nb_2O_5$, and wherein the floating gate is a single thin film.

2. A nonvolatile memory device comprising:
a semiconductor substrate on which a source, a drain, and a channel region are formed;
a tunneling oxide film formed on the channel region;
a floating gate formed of a transition metal oxide (TMO) on the tunneling oxide;
a blocking oxide film formed on the floating gate; and
a gate electrode formed on the blocking oxide film, wherein the floating gate is an array of nanoparticles and the TMO is a material selected from the group consisting of $Nb_2O_5$.

3. A method of manufacturing a nonvolatile memory device, comprising:
preparing a semiconductor substrate on which a source, a drain, and a channel region are formed;
forming a tunneling oxide film on the channel region;
forming a floating gate on the tunneling oxide using a transition metal oxide (TMO);
forming a blocking oxide film on the floating gate; and
forming a gate electrode on the blocking oxide film, wherein the TMO is a material selected from the group consisting of $Nb_2O_5$, and wherein the floating gate is a single thin film.

4. A method of manufacturing a nonvolatile memory device, comprising:
preparing a semiconductor substrate on which a source, a drain, and a channel region are formed;
forming a tunneling oxide film on the channel region;
forming a floating gate on the tunneling oxide using a transition metal oxide (TMO);
forming a blocking oxide film on the floating gate; and
forming a gate electrode on the blocking oxide film, wherein the floating gate is an array of nanoparticles and the TMO is a material selected from the group consisting of $Nb_2O_5$.

5. The method of claim 3, wherein the forming of the floating gate using a TMO is forming the floating gate by depositing a TMO using a PVD method on the tunneling oxide.

6. The method of claim 5, wherein an oxygen content of the TMO is controlled when depositing the TMO.

7. A nonvolatile memory device comprising:
a semiconductor substrate on which a source, a drain, and a channel region are formed;
a tunneling oxide film formed on the channel region;
a floating gate formed of a transition metal oxide (TMO) on the tunneling oxide film;
a blocking oxide film formed on the floating gate; and
a gate electrode formed on the blocking oxide film, wherein the floating gate comprises an array of nanowires.

8. The nonvolatile memory device of claim 7, wherein the nanowires are formed of $Nb_2O_5$, NiO, or $ZrO_2$.

9. A method of manufacturing a nonvolatile memory device, comprising:
preparing a semiconductor substrate on which a source, a drain, and a channel region are formed;
forming a tunneling oxide film on the channel region;
forming a floating gate on the tunneling oxide film using a transition metal oxide (TMO);
forming a blocking oxide film on the floating gate; and
forming a gate electrode on the blocking oxide film, wherein the floating gate comprises an array of nanowires.

10. The method of claim 9, wherein the nanowires are formed of $Nb_2O_5$, NiO, or $ZrO_2$.

* * * * *